US007994612B2

(12) United States Patent
Anderson et al.

(10) Patent No.: US 7,994,612 B2
(45) Date of Patent: Aug. 9, 2011

(54) FINFETS SINGLE-SIDED IMPLANT FORMATION

(75) Inventors: Brent A. Anderson, Jericho, VT (US); Andres Bryant, Burlington, VT (US); Josephine B. Chang, Mahopac, NY (US); Omer H. Dokumaci, Hartsdale, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 12/106,476

(22) Filed: Apr. 21, 2008

(65) Prior Publication Data
US 2009/0261425 A1   Oct. 22, 2009

(51) Int. Cl.
*H01L 21/02* (2006.01)
(52) U.S. Cl. ......... 257/611; 257/E29.268; 257/E29.279; 257/E21.427; 438/179
(58) Field of Classification Search .................. None
See application file for complete search history.

(56) References Cited

U.S. PATENT DOCUMENTS

| 6,171,913 | B1  | 1/2001  | Wang et al. |
| 6,300,182 | B1  | 10/2001 | Yu |
| 6,396,103 | B1  | 5/2002  | Riccobene et al. |
| 6,800,905 | B2  | 10/2004 | Fried et al. |
| 6,858,478 | B2* | 2/2005  | Chau et al. ..................... 438/149 |
| 6,967,143 | B2  | 11/2005 | Mathew et al. |
| 7,064,019 | B2  | 6/2006  | Fried et al. |
| 7,064,022 | B1  | 6/2006  | Hill et al. |
| 2003/0113970 | A1* | 6/2003  | Fried et al. ..................... 438/286 |
| 2004/0217433 | A1* | 11/2004 | Yeo et al. ....................... 257/412 |
| 2007/0029624 | A1* | 2/2007  | Nowak .......................... 257/401 |

* cited by examiner

*Primary Examiner* — Jarrett J Stark
(74) *Attorney, Agent, or Firm* — Gibb I.P. Law Firm, LLC; Richard M. Kotulak, Esq.

(57) ABSTRACT

A method patterns pairs of semiconducting fins on an insulator layer and then patterns a linear gate conductor structure over and perpendicular to the fins. Next, the method patterns a mask on the insulator layer adjacent the fins such that sidewalls of the mask are parallel to the fins and are spaced from the fins a predetermined distance. The method performs an angled impurity implant into regions of the fins not protected by the gate conductor structure and the mask. This process forms impurity concentrations within the fins that are asymmetric and that mirror one another in adjacent pairs of fins.

9 Claims, 3 Drawing Sheets

FINFETS SINGLE-SIDED IMPLANT FORMATION

BACKGROUND

1. Field of the Invention

The embodiments of the invention generally relate to semiconductor structures and methods, and more particularly to a fin-type field effect transistor (FinFET) formation method and resulting structure where impurity concentrations within the fins are asymmetric and mirror one another in adjacent pairs of fins.

2. Description of the Related Art

FinFETs are field-effect transistors (FET)s where the body of the FET is a block or fin of single-crystal semiconductor material and gates are formed on the fin. For a complete discussion of FinFETs, see U.S. Pat. No. 7,323,374 the complete disclosure of which is hereby incorporated by reference.

Angled implants of impurities (dopants) are especially useful in transistors that utilize fin structures because of the rectangular shape of the fin. Fins have sidewalls that are many times (at least to 2×) greater in height (above the insulator substrate) than the fin is wide. Therefore, it is more effective to apply implants to the relatively larger sidewalls than it is to implant impurities through the relatively smaller top of the fin (in a process which is sometimes referred to as "top-down" implanting).

Top-down implanting has limitations because, in order to attain homogeneous doping throughout the fin, top down implanting requires very high energy implants and high thermal cycles. Other limitations of top-down implanting relate to the amorphization limit and large lateral gradient. Therefore, angling the implants is a more effective process for implanting impurities into fin shaped structures.

However, one problem that occurs when implanting impurities into fin-type transistors is that, as the size of transistors is reduced, shadowing can occur because of various structures, such as masks, that can be adjacent to certain fins. This shadowing can prevent the formation of homogeneous doping.

In one example, the mask utilized for well and source/drain doping can cause some, but not all, of the fins within a multi-fin transistor to be shadowed preventing all the fins from receiving the full impurity implant. For example, fins that are closest to the mask structure may be shadowed, while fins that are more interior to the structure (and are further away from the mask) may not be shadowed. This causes inconsistent doping within the fins of the transistors when angled implants are utilized. Such inconsistent doping can cause the transistors to be unbalanced, and shadowing can occur intermittently, causing the performance of the transistors also to be inconsistent.

SUMMARY

In view of the foregoing, embodiments herein change the shape of the masks (such as the well and source/drain masks) around pairs of parallel fins so that angled source/drain implants will cause impurities to be consistently implanted on only one side of the fin. This allows of the fins to be consistently asymmetrically implanted with impurities and allows designers to rely upon such consistent asymmetric implantation when designing such transistors.

In other words, rather than trying to eliminate or compensate for the inconsistent doping that can occur when angled impurity implants are shadowed, the present embodiments rely upon and use such shadowing to consistently only implant one side of all the fins. By relying upon and utilizing the shadowing, the present embodiments allow designers to adjust the doping profiles knowing that the impurity implants will be performed in a consistent manner. Embodiments herein produce uniform electrostatics along the full height of fin, including vertically uniform extension implants, vertically uniform halo implants, vertically uniform gate activation implants, etc.

More specifically, an exemplary embodiment of the invention provides a method that patterns pairs of semiconducting fins on an insulator layer and then patterns a linear gate conductor structure over and perpendicular to the fins. Next, the method patterns a mask (e.g., well and source/drain mask) on the insulator layer adjacent the fins such that sidewalls of the mask are parallel to the fins and are spaced from the fins a predetermined distance. This "predetermined distance" will vary depending upon the angle at which the angle implants are performed and upon the height of the mask.

The method performs an angled impurity implant into regions of the fins not protected by the gate conductor structure and the mask. Thus, the mask blocks the angled impurity implant from reaching one side of the fins. This process forms impurity concentrations within the fins that are asymmetric and that mirror one another in adjacent pairs of fins. The angled impurity implant is performed such that only one side of the fins receives the impurity. Therefore, the impurity concentration will be greater on one side of the fin relative to the other site of the fin. Stated differently, a first impurity concentration along a first sidewall of the fins is different than a second impurity concentration along a second sidewall of the fins that is opposite the first sidewall.

However, while the impurity concentrations are asymmetrical across the width of the fin, they are consistent along the height of the fin, for each different portion of the width of the fin. In other words, a first impurity concentration is consistent along the full height of a first sidewall of the fin, and a second impurity concentration is consistent along the full height of an opposite second sidewall of the fin. Thus, while the impurity concentration changes across the width of the fin, within each localized width portion of the fin, the impurity concentration is substantially uniform from the top to the bottom of that width portion, because the impurity is implanted from the side of the fin in an angled implant and the impurity is implanted substantially evenly up and down the height of the fin.

The foregoing process produces a transistor structure that includes at least one fin (and can include pairs of semiconducting fins on an insulator layer) and a linear gate conductor structure over and perpendicular to the fins. The fins include a channel region below the gate conductor structure and source and drain regions adjacent the channel region. The source and drain regions comprise portions of the fins that are not covered by the gate conductor structure.

As mentioned above, one feature of the embodiments herein is that the source and drain regions comprise asymmetric impurity concentrations that mirror one another in adjacent pairs of fins. Thus, the side of the fins that contains a greater impurity concentration alternates between adjacent fins.

The asymmetric impurity concentrations comprise a first impurity concentration along a first sidewall of the fins that is different than a second impurity concentration along a second sidewall of the fins that is opposite the first sidewall. Further, the asymmetric impurity concentrations gradually decrease from one sidewall of the fins to an opposite sidewall of the fins.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
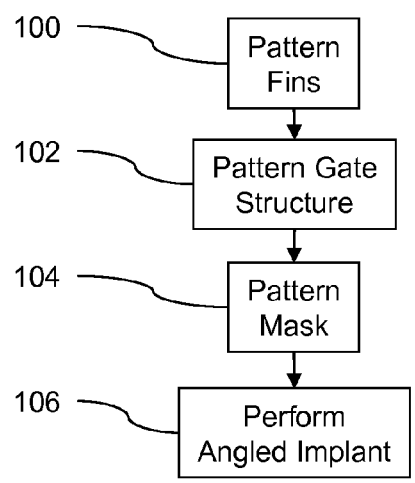
FIG. 1 is a flow diagram illustrating a method of an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, one problem that occurs when implanting impurities into fin-type transistors is that, as the size of transistors is reduced, shadowing can occur because of various structures, such as masks, that can be adjacent to certain fins. This shadowing can prevent the formation of homogeneous doping.

In view of the foregoing, embodiments herein change the shape of the masks (such as the well and source/drain masks) around pairs of parallel fins so that angled source/drain implants will cause impurities to be consistently implanted on only one side of the fin. This allows of the fins to be consistently asymmetrically implanted with impurities and allows designers to rely upon such consistent asymmetric implantation when designing such transistors.

In other words, rather than trying to eliminate or compensate for the inconsistent doping that can occur when angled impurity implants are shadowed, the present embodiments rely upon and use such shadowing to consistently only implant one side of all the fins. By relying on and utilizing the shadowing, the present embodiments allow designers to adjust the doping profiles knowing that the impurity implants will be performed in a consistent manner. Embodiments herein produce uniform electrostatics along the full height of fin, including vertically uniform extension implants, vertically uniform halo implants, vertically uniform gate activation implants, etc.

More specifically, as shown in flowchart form in FIG. 1, an exemplary embodiment of the invention provides a method that patterns pairs of semiconducting fins on an insulator layer 100 and then patterns a linear gate conductor structure over and perpendicular to the fins 102. Next, the method patterns a mask (e.g., well and source/drain mask) on the insulator layer adjacent the fins 104 such that sidewalls of the mask are parallel to the fins and are spaced from the fins a predetermined distance. This "predetermined distance" will vary depending upon the angle at which the angle implants are performed and upon the height of the mask. The method performs an angled impurity implant into regions of the fins not protected by the gate conductor structure and the mask 106.

Figure 2:
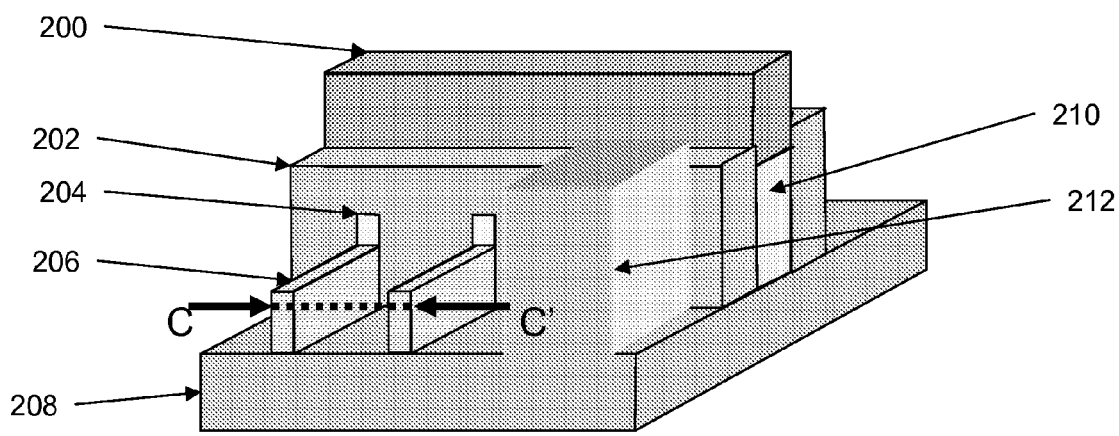
FIG. 2 is a schematic diagram of a structure embodiment herein.

Thus, as shown in FIG. 2, the foregoing process produces a transistor structure that includes at least one fin 206 (and can include pairs of semiconducting fins 206 on an insulator layer 208) and a linear gate conductor structure 200, 202, 210 over and perpendicular to the fins 206. The structure also includes a fin cap 204 above the fin 206. Further, the linear gate conductor structure includes a conductor 210 (polysilicon, etc.) sidewall spacers 202 adjacent the sidewalls of the gate conductor 210 and a gate conductor cap 200. The fins 206 include a channel region below the gate conductor structure 200, 202, 210 and source and drain regions adjacent the channel region. The source and drain regions comprise portions of the fins 206 that are not covered by the gate conductor structure 200, 202, 210. For a complete discussion of the methods, materials, and processes utilized in the formation of FinFETs, see U.S. Pat. No. 7,323,374, mentioned above.

Figure 3:
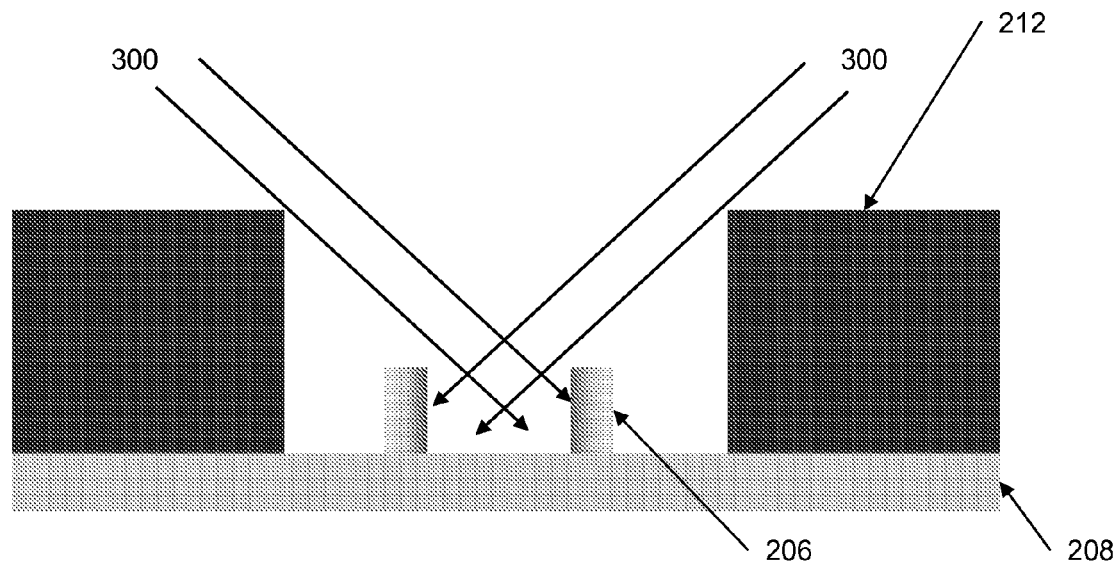
FIG. 3 is a schematic diagram of a structure embodiment herein.

A temporary mask 212 (which is not necessarily included in the final structure) is also shown in FIG. 2. As shown in FIG. 3, the mask 212 blocks the angled impurity implant 300 from reaching one side of the fins 206. Thus, the mask 212 only allows the impurity 300 to reach one side of the fins 206; however, because the impurity implant 300 is angled, it is substantially evenly applied along full height of the fin 206 (symmetrically from the top to the bottom of the fin 206).

Figure 4:
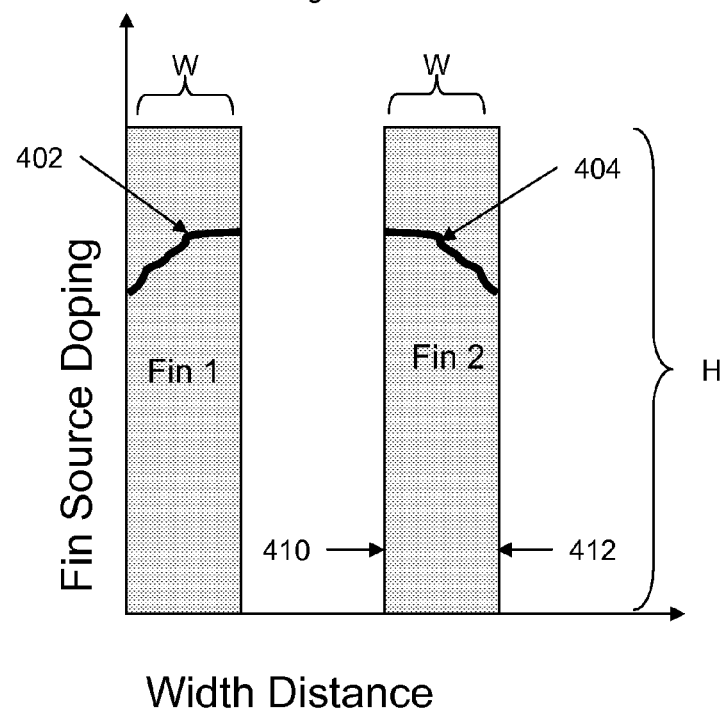
FIG. 4 is a schematic diagram illustrating asymmetric doping concentrations across the width of the fins.

This process forms impurity concentrations within the fins 206 that are asymmetric across the width of the fin and that mirror one another in adjacent pairs of fins 206. More specifically, as shown in FIG. 4, the relative impurity concentrations 402, 404 of Fin 1 and Fin 2 vary across the width of the fin (where the width W of the fin is the region between sidewalls of the fins).

The angled impurity implant is performed such that only one side of the fins 206 receives the impurity. Therefore, the impurity concentration will be greater on one side 410 of the fin 206 relative to the other side 412 of the fin 206. Stated differently, a first impurity concentration along a first sidewall 410 of the fin 206 is different than a second impurity concentration along a second sidewall 412 of the fin 206 that is opposite the first sidewall as shown by the impurity concentration curves 402, 404. The asymmetric impurity concentrations gradually decrease from one sidewall 410 of the fins 206 to an opposite sidewall 412 of the fins 206.

However, while the impurity concentrations are asymmetrical across the width W of the fins 206, they are consistent along the height (H) of the fin 206, for each different portion of the width of the fin 206. In other words, a first impurity concentration is consistent along the full height H of a first sidewall of the fin 206, and a second impurity concentration is consistent along the full height H of an opposite second sidewall of the fin 206. Thus, while the impurity concentration changes across the width W of the fin 206, within each localized width portion of the fin 206, the impurity concentration is substantially uniform from the top to the bottom of that width portion, because the impurity is implanted from the side of the fin 206 in an angled implant and the impurity is implanted substantially evenly across the height of the fin 206.

As mentioned above, one feature of the embodiments herein is that the source and drain regions comprise asymmetric impurity concentrations that mirror one another in adjacent pairs of fins 206. This is shown in FIG. 4 where the greatest impurity concentration of Fin 1 occurs along the right sidewall while the greatest impurity concentration of Fin 2 occurs along the left sidewall (the sidewall of Fin 2 that is closest to Fin 1). Thus, the side of the fins 206 that contains a greater impurity concentration alternates between adjacent fins 206. This is accomplished because, as shown in FIG. 3, the mask 212 isolates pairs of adjacent fins 206 such that the sidewalls of the fins 206 that are closest to the mask 212 do not receive the angled implant 300, while the sidewalls that are adjacent to the other fin receive a full amount of the angled implant 300.

Figure 5:
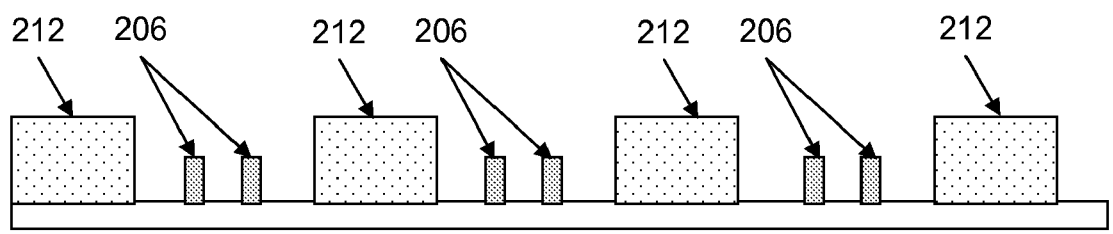
FIG. 5 is a schematic diagram of a structure embodiment herein.

Further, as shown in FIG. 5, the mirrored fins shown in FIG. 4 occur in pairs. More specifically, each pair of fins 206 will be separated during the angled implant 300 by the mask 212. Thus, each of the pairs of fins 206 will comprise mirror images of each other from a doping profile standpoint.

Thus, as mentioned above, embodiments herein change the shape of the masks (such as the well and source/drain masks) around pairs of parallel fins so that angled source/drain implants will cause impurities to be consistently implanted on only one side of the fin. The present embodiments rely upon and use shadowing to consistently only implant one side of all the fins. By relying upon and utilizing the shadowing, the present embodiments allow designers to adjust the doping profiles knowing that the impurity implants will be performed in a consistent manner.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A structure comprising:
    a semiconducting fin, having a longitudinal axis, disposed on an insulator layer, said semiconducting fin comprising a top surface, and first side and second side surfaces separated by a width, which is orthogonal in direction to said longitudinal axis; and
    a gate conductor structure formed over a portion of said top surface and said first and second side surfaces of said semiconducting fin;
    wherein said semiconducting fin comprises:
        a channel region below said gate conductor structure; and
        source and drain regions separated along said longitudinal axis by said channel region and each of said source and drain regions being adjacent said channel region, wherein said source and drain regions comprise portions of said semiconducting fin that are not covered by said gate conductor structure,
    wherein each of said source and drain regions comprises asymmetric impurity concentrations across said width of said semiconducting fin, such that a first impurity concentration at said first side surface and a second impurity concentration at said second side surface of said semiconducting fin differ.

2. The structure according to claim 1, wherein said first impurity concentration is disposed at a first height of said first side surface and said second impurity concentration is disposed at a second height of said second side surface along a length of each of said source and drain regions.

3. The structure according to claim 1, wherein said asymmetric impurity concentrations vary monotonically from said first impurity concentration to said second impurity concentration across said width of said semiconducting fin.

4. A structure comprising:
    a first semiconducting fin and a second conducting fin disposed longitudinally in parallel on an insulator layer, each of said first and second conducting fins having a longitudinal axis and an equal height and a width, which is orthogonal in direction to said longitudinal axis, and each comprising a top surface, and an outer surface, which is parallel to said longitudinal axis and distal to a point disposed between said first and second conducting fins, when compared to an inner surface, which is parallel to said longitudinal axis and proximate to said point, said outer surface and said inner surface being separated by said width of each of said first and second conducting fins; and
    a gate conductor structure formed over equivalent portions of said top surface and said outer and inner surfaces of said first and second semiconducting fins;
    wherein each of said first and second semiconducting fins comprises:
        a channel region below said gate conductor structure; and
        source and drain regions separated along said longitudinal axis by said channel region and each of said source and drain regions being adjacent said channel region, wherein said source and drain regions comprise portions of said first and second semiconducting fins that are not covered by said gate conductor structure,
    wherein each of said source and drain regions of said first and second semiconducting fins comprises asymmetric impurity concentrations across each of said widths of said first and second semiconducting fins, such that a first impurity concentration at said outer surface of said first semiconducting fin equals said first impurity concentration of said outer surface of said second semiconducting fin, and a second impurity concentration of said inner surface of said first semiconducting fin equals said second impurity concentration of said inner surface of said second semiconducting fin.

5. The structure according to claim 4, wherein said first impurity concentration disposed at a first height of said outer surface of said first semiconducting fin is equal to a first height of said outer surface of said second semiconducting fin, and said second impurity concentration disposed at a second height of said inner surface of said first semiconducting fin is equal to a second height of said inner surface of said second semiconducting fin.

6. The structure according to claim 4, wherein said asymmetric impurity concentrations vary monotonically from said first impurity concentration to said second impurity concentration across each of said widths of each of said first and second semiconducting fins.

7. A structure comprising:
a plurality of pairs of semiconducting fins disposed longitudinally in parallel on an insulator layer, each of said pairs of semiconducting fins comprising first and second conducting fins having a longitudinal axis and an equal height and a width, which is orthogonal in direction to said longitudinal axis, and each of said first and second conducting fins comprising a top surface, and an outer surface, which is parallel to said longitudinal axis and distal to a point disposed between said first and second conducting fins, when compared to an inner surface, which is parallel to said longitudinal axis and proximate to said point, said outer surface and said inner surface being separated by said width of each of said first and second conducting fins; and
a gate conductor structure formed over equivalent portions of said top surface and said outer and inner surfaces of said first and second semiconducting fins of each of said pairs of semiconducting fins;
wherein each of said first and second semiconducting fins of each of said pairs of semiconducting fins comprises:
a channel region below said gate conductor structure; and
source and drain regions separated along said longitudinal axis by said channel region and each of said source and drain regions being adjacent said channel region, wherein said source and drain regions comprise portions of said first and second semiconducting fins of each of said pairs of semiconducting fins that are not covered by said gate conductor structure,
wherein each of said source and drain regions of each of said first and second semiconducting fins of each of said pairs of semiconducting fins comprises asymmetric impurity concentrations across each of said widths of said first and second semiconducting fins, such that a first impurity concentration at said outer surface of said first semiconducting fin equals said first impurity concentration of said outer surface of said second semiconducting fin, and a second impurity concentration of said inner surface of said first semiconducting fin equals said second impurity concentration of said inner surface of said second semiconducting fin.

8. The structure according to claim 7, wherein said first impurity concentration is disposed at a first height of said outer surface of said first semiconducting fin that is equal to a first height of said outer surface of said second semiconducting fin, and said second impurity concentration is disposed at a second height of said inner surface of said first semiconducting fin that is equal to a second height of said inner surface of said second semiconducting fin of each of said pairs of semiconducting fins.

9. The structure according to claim 7, wherein said asymmetric impurity concentrations vary monotonically from said first impurity concentration to said second impurity concentration across each of said widths of each of said first and second semiconducting fins of each of said pairs of semiconducting fins.

* * * * *